United States Patent [19]

Immorlica, Jr. et al.

[11] Patent Number: 5,151,769
[45] Date of Patent: Sep. 29, 1992

[54] OPTICALLY PATTERNED RF SHIELD FOR AN INTEGRATED CIRCUIT CHIP FOR ANALOG AND/OR DIGITAL OPERATION AT MICROWAVE FREQUENCIES

[75] Inventors: Anthony A. Immorlica, Jr., Manlius; Robert F. Chase, Fayetteville, both of N.Y.

[73] Assignee: General Electric Company, Syracuse, N.Y.

[21] Appl. No.: 680,376

[22] Filed: Apr. 4, 1991

[51] Int. Cl.⁵ .................. H01L 29/40; H01L 23/02; H01L 23/16; H01L 25/04
[52] U.S. Cl. ............................. 357/53; 357/74; 357/75; 357/80; 357/84
[58] Field of Search ............... 357/74, 75, 80, 84, 357/53

[56] References Cited

U.S. PATENT DOCUMENTS

| | | | |
|---|---|---|---|
| 4,739,389 | 4/1988 | Goedbloed | 357/75 |
| 4,907,061 | 3/1990 | Kohara | 357/74 |
| 4,942,450 | 7/1990 | Iwashita | 357/84 |
| 4,958,222 | 9/1990 | Takakura et al. | 357/84 |
| 5,050,238 | 9/1991 | Tomizuka et al. | 357/84 |

Primary Examiner—J. Carroll
Attorney, Agent, or Firm—Paul Checkovich; Stephen A. Young

[57] ABSTRACT

The invention relates to the provision of an RF shield for an individual or a collection of integrated circuit chips in a module containing a plurality of hybrid interconnected chips generating interfering RF fields that would interfere with operation of that chip if unshielded. The chips in the module may function in the analog and/or digital mode. The RF shield comprises separate metallizations under and over the chip, the two metallizations being interconnected by a line of discrete electrically conductive vias forming cage-like sides to complete an electrically conductive enclosure about the chip. The vias are spaced closely enough to prevent the escape or entry of RF waves at the frequencies of interest. The RF shield is advantageously fabricated using metallizations and vias that are optically patterned by the same process steps used to effect hybrid interconnection of the chips.

7 Claims, 2 Drawing Sheets

OPTICALLY PATTERNED RF SHIELD FOR AN INTEGRATED CIRCUIT CHIP FOR ANALOG AND/OR DIGITAL OPERATION AT MICROWAVE FREQUENCIES

BACKGROUND OF THE INVENTION

1. Field of the Invention

The invention relates to the provision of RF shielding for an individual or collection of integrated circuit chip operating at microwave frequencies. The invention is applicable to chips operating in an analog and/or digital mode and deals with the shielding of that integrated circuit chip from interfering fields at microwave frequencies produced by other integrated circuit chips in proximity to the subject chip and contained within a common enclosure.

2. Description of the Prior Art

Integrated circuits operating with analog signals at frequencies in the Gigahertz range are now commonplace. A preferred material for the individual chips is one of the materials having semiconducting properties facilitating high frequency operation such as gallium arsenide. Gallium arsenide has the added advantage of being semi-insulating, allowing conductor runs and passive circuit components to be formed on insulating portions of the surface of the chip without the losses customarily associated with conductor runs formed on silicon or germanium. In fabricating the chips for operation at microwave frequencies both passive and active circuit elements are sufficiently compact for inclusion on the surface of a reasonable sized chip. The active and passive elements, the I/O pads and the interconnections are photolithographically patterned and the resulting device is termed a "monolithic microwave integrated circuit" (MMIC). Because of a variety of fabrication and performance problems, it is usually most convenient to make up higher level circuits performing a higher level function from a plurality of interconnected MMIC chips thus creating a "hybrid" MMIC assembly, which when packaged, is usually termed a "module".

The efficient and low cost interconnection of such MMIC chips becomes a major challenge for successful module performance. Within the modules, which tend to become quite small at the higher frequencies, the individual chips should be interconnected by connections which preserve transmission line quality (i.e. maintain transmission line impedances and avoid reflection causing discontinuities) and which are short to minimize time delays in processing the signal. In addition, if the individual chips are subject to digital controls, a large number of interconnections may be required, which, as the module sizes go down, become more and more closely spaced.

A high density interconnection (HDI) technique has been proposed to meet this challenge. The technique is described in two patents assigned to the Assignee of the present application (U.S. Pat. No. 4,783,695, filed Sept. 26, 1986 entitled "Multichip Integrated Circuit Packaging Configuration and Method"/C. W. Eichelberger and R. J. Wojnarowski and U.S. Pat. No. 4,894,115, filed Feb. 14, 1989 and entitled "Laser Beam Scanning Method for Forming Via Holes in Polymer Materials"/C. W. Eichelberger, R. J. Wojnarowski and K. B. Welles), describes a method using optical patterning of interconnecting MMIC chips requiring the high density of connections adequate to meet the need in such modules.

The HDI process is applicable to high frequency operation where monolithic microwave integrated circuits (MMIC) handling analog signals are involved, to digital circuitry handling digital information, and to mixed microwave and digital circuitry in which the role of the digital circuitry is to control the analog functions.

A common module for mixed analog/digital operation is a microwave transmit/receive module for phased array systems for satellite communication or for radar systems.

The HDI chip interconnection process, as described in the cited patents, conventionally uses a substrate of alumina supporting MMIC chips of gallium arsenide. In the process, the chips are supported in recesses on the alumina substrate with the upper surfaces of both the chips and the substrate flush and with the pads on the chips and adjacent metallization runs on the substrate exposed A thin optically patternable solid dielectric layer is then adhered to the flush surfaces. The dielectric layer bridges small gaps in the underlying surface and accommodates small variations between the heights of the surfaces. Next, "via" holes are etched down through the dielectric to the chip pads and substrate metallizations between which connections are to be made. An optically patterned metallization, as described in the cited patents, is then formed on the dielectric layer which passes down through the vias and interconnects the pads on the chips with the metallizations on the substrate. The process permits successive dielectric layers and successive metallizations to be added for achieving cross-overs, and may be patterned to a high resolution limit. The process provides efficient paths for both microwave signals, digital controls, and DC biases and permits increased package density.

Unfortunately, increasing package density which brings the MMIC chips together, increases stray RF coupling which may prevent one chip from functioning properly in proximity to another. In the particular case of a module for a phased array radar system, high gain circuits operating at low power levels may pick up RF fields from circuits operating at high power levels. Similiary, noise from digitally operated circuits may enter the signal paths and disrupt the operation of the high gain circuits. Stray fields should be prevented from interfering with chip performance. Granted that shielding is an answer, it is highly desirable that it be compatible with the interconnection process which allows increased package density.

SUMMARY OF THE INVENTION

Accordingly it is an object of the present invention to provide an RF shield for a MMIC chip.

It is another object to provide an optically patterned RF shield for a MMIC chip, in close association with other MMIC chips within a common module.

It is a further object to provide an optically patterned RF shield for a MMIC chip which uses optically controlled steps common to the process of interconnecting said chips or a collection of MMIC chips.

These and other objects of the invention are achieved in a module for analog and/or digital operation at microwave frequencies comprising a plurality of integrated circuit chips in close proximity, all supported upon a common substrate within the module.

In accordance with the invention, an optically patterned R shield is provided for shielding one chip from the other chips, the shielded chip being supported in a recess in the substrate. The substrate is recessed to support the chip with its upper surface flush with the surface of the substrate.

A first part of the RF shield is formed from a first metallization, which covers the interior of the recess and the adjacent surface of the substrate. This layer forms the bottom and a part of the sides of the RF shield.

A second part of the RF shield is formed from an optically patterned first dielectric layer which supports an optically patterned second metallization bonded to the chip and substrate portion. A first set of local perforations penetrate the first dielectric layer to the first metallization. They occur at regular intervals in a line bounding the chip and further defining the sides of the RF shield. The second metallization provides conductive paths via the first set of perforations to the first metallization, thus forming a second part of the sides of the RF shield.

A third part of the RF shield comprises an optically patterned second dielectric layer bonded to the first dielectric layer which supports an optically patterned third metallization. A second set of local perforations penetrate the second dielectric layer to the second metallization closely following the boundary line defining the sides of the RF shield. The third metallization has a central portion covering the recess and extends to the second set of perforations to provide conductive paths via the second set of perforations to the second metallization. The third metallization forms the top and completes the sides of the RF shield.

The RF shielding is formed efficiently and compatibly with the process for interconnecting the chips. Typically one or both of the dielectric layers and one or both of the second and third metallizations, used to form the RF shield, are also used for point-to-point electrical connections to the shielded chip.

BRIEF DESCRIPTION OF THE DRAWINGS

The inventive and distinctive features of the application are set forth in the claims of the present invention. The invention itself, however, taken with further objects and advantages thereof may best be understood by to the following description and drawings, in which:

DESCRIPTION OF THE PREFERRED EMBODIMENT

Figure 1:
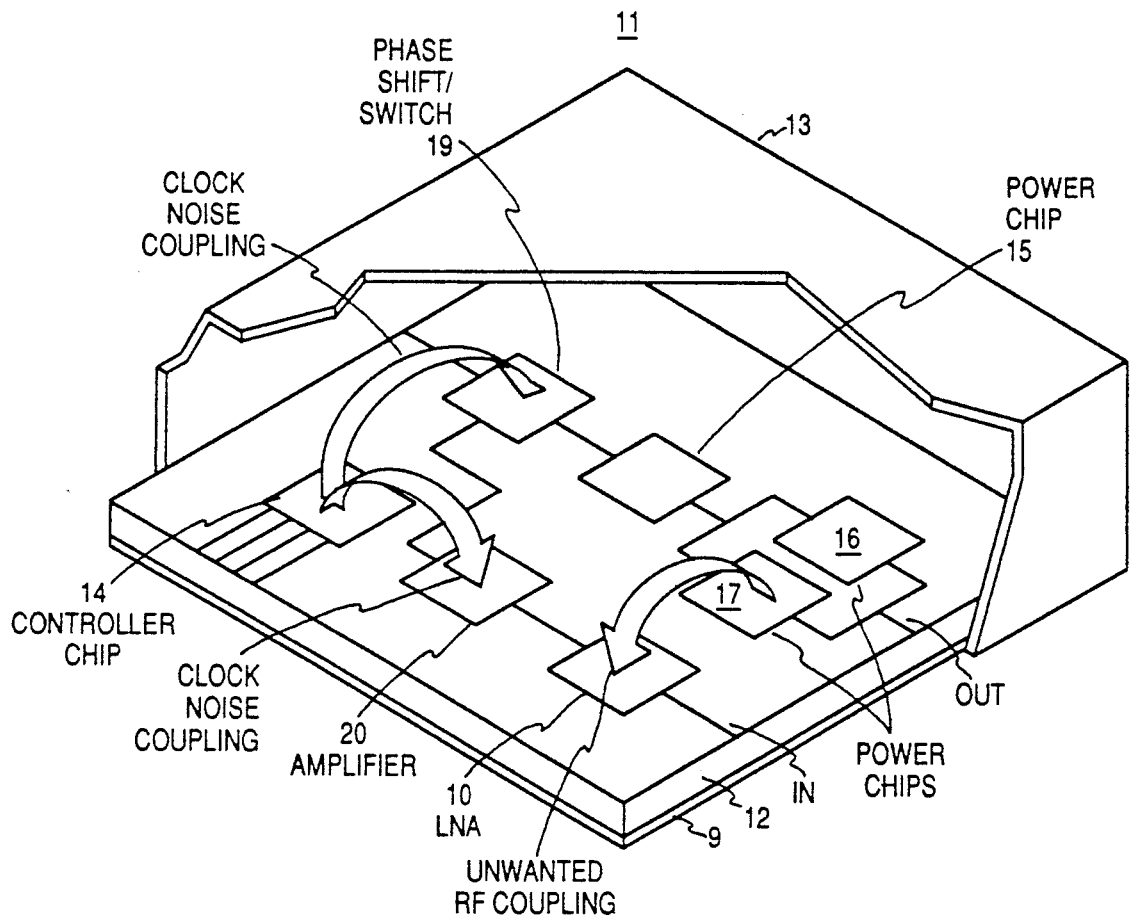
FIG. 1 is an illustration of a microwave module in plurality of integrated circuit chips are pro for microwave or millimeter wave operation, and in which the shielding of individual chips or a collection of chips is desired to avoid stray RF coupling between chips that would impair module performance.

FIG. 1 is an illustration of an exemplary microwave module to which an RF shield for an individual chip in accordance with the present invention has application.

The microwave module 11 ,which is shown in the simplified illustration of FIG. 1, consists of a substrate 12, a cover 13 sealed to the substrate to complete a sealed enclosure, and a plurality of integrated circuit chips (10, 14, 15, 16, 17, 18, 19, 20) within the enclosure distributed over the surface of the substrate. Conventionally the substrate 12, which is usually of a dielectric, but occasionally of a semi-conducting material, is provided with a conductive layer, on its upper surface which is patterned with electrical lines. The undersurface (backside) of the substrate is uniformly coated with metal to form a ground plane 9. The ground plane is electrically connected to the cover 13, which also is either of a metallic material or of metallized material, the two completing an RF shield about the enclosed electronic components. At microwave operating frequencies, the enclosure prevents either the escape of undesired electromagnetic radiation from the module or the entry of significant external electromagnetic radiation into the interior of the module. The shielded enclosure, however, intercepts radiation which would otherwise escape from the contained integrated circuits, and reflects it back into the package, increasing the RF coupling between individual chips within the module, and creating the possibility of a cavity resonance within the shielded space. The coupling may also be attributable to the mere proximity of different circuits to one another providing stray coupling resulting in feedback, unwanted signal paths, or noise. While increasing the distance between the chips increases the attenuation, and decreases the coupling between the chips, it is usually desirable to reduce this distance to a minimum. Increasing the proximity is desirable in the interest of savings in space, substrate area and in increasing electrical efficiency in shortening RF transmission paths.

The illustrated module provides the transmit/ receive function for an element of a phased array radar system. Two principal kinds of interference that are likely to occur in modular electronics operating in an analog mode at higher frequencies or digitally at very high data rates are illustrated: unwanted coupling of the RF signal between high level and low level circuits, and clock noise from digital control circuitry.

The invention is of application to a variety of systems requiring a plurality of hybrid interconnected MMIC circuits in a module where compactness is required. Such systems include communication, radar, and very high speed digital systems.

In the radar module depicted in FIG. 1, the particular need for RF shielding exists when a low noise amplifier 10 in the receiving chain coexists in the module with a power amplifier (15, 16, 17) in the transmitting chain and must be isolated to preserve weak signal sensitivity. A similar requirement is that of isolating digital phase shifter (19) and signal amplifiers (20), which operate at both low and moderate signal levels, from the clock noise generated from the controller chip (14). The controller chip provides clock controlled digital commands for setting the phase shifters. Ditigal commands may contain broad spectrum noise reaching into the signal passband In the above example, the RF signal fields are of high frequency (typically above one Gigahertz) and the wide spectrum clock noise produces components in the same frequency domain. At such frequencies, conventional integrated circuit metallizations (e.g. 4-5 microns) produced by photolithography provide adequate RF shielding. At these frequencies either a continuous metallization or an apertured "cage" with small openings relative to the wavelengths of the unwanted RF field will prevent both electrostatic coupling an electromagnetic coupling. The shielding is effective without requiring either highly permeable magnetic materials or conductive layers of a more substantial thickness.

The effectiveness of the shielding increases with frequencies. As a practical example, the field which exists beyond the outer conductor of a stripline, at a short distance (eg 25 microns) measured on the center line of the stripline remains below −46 DB varying from −46 DB at 0.2 GHZ to from −70 to −80 DB at 10 GHZ and above; the conductive layers being of conventional thickness. The example indicates the very substantial attenuation that a thin intervening conductive layer can provide.

Figure 3:
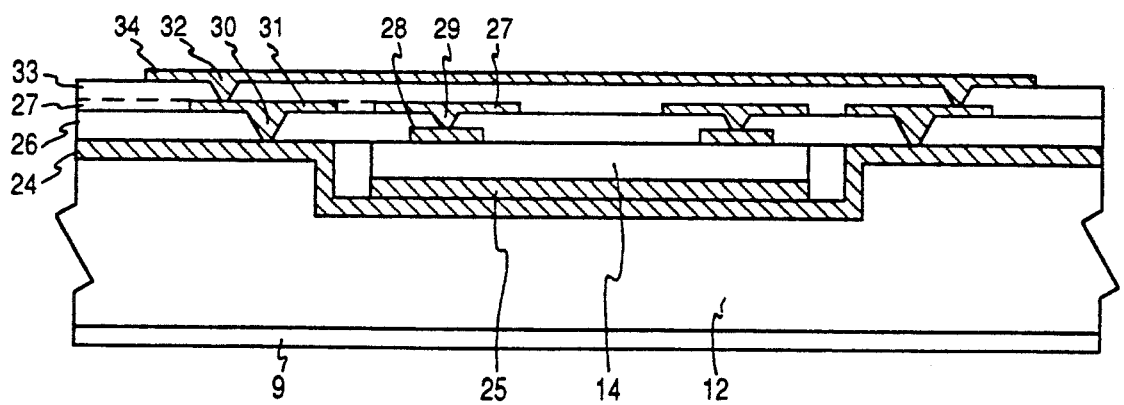
FIG. 3 is a drawing taken in section of the sheielding associated with a single MMIC chip.
Figure 2:
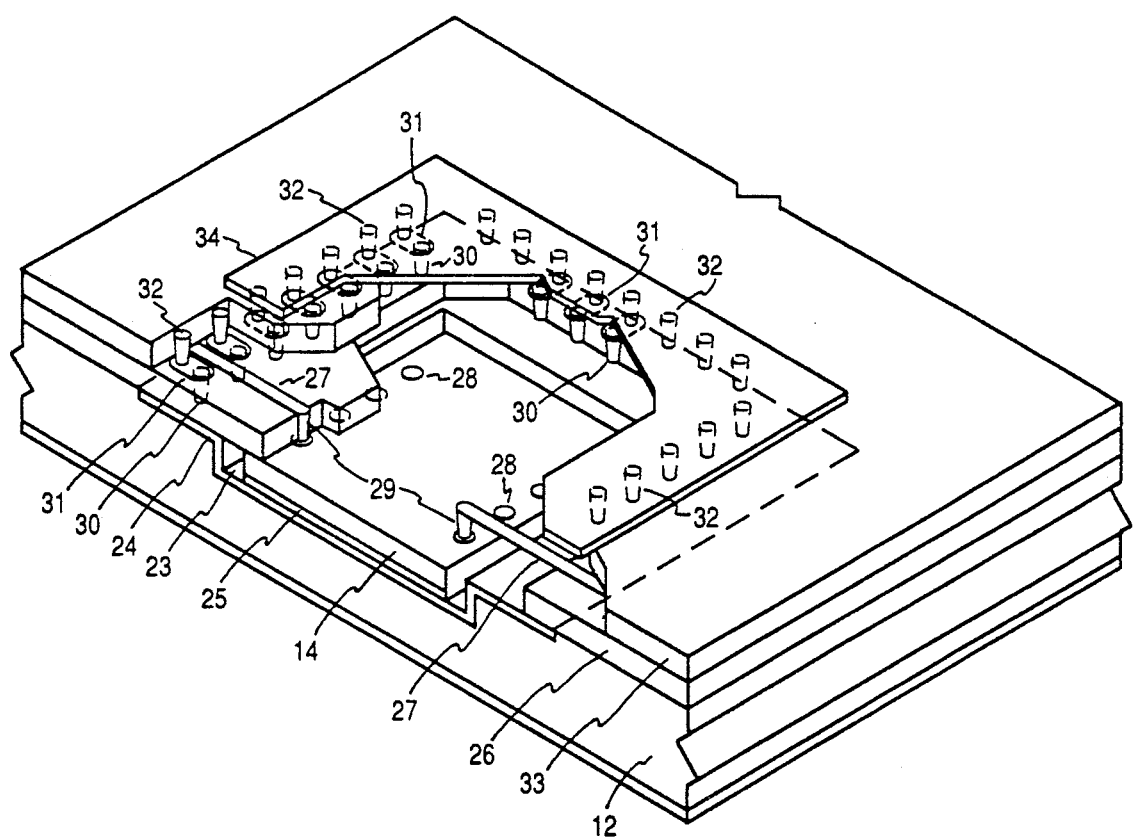
FIG. 2 is a perspective view taken partially in section a single integrated circuit chip enclosed within an optically patterned RF shield in accordance with the invention which prevents RF coupling with other chips within the module.

Turning now to FIGS. 2 and 3, a novel RF shield for an integrated circuit chip operating in the microwave range is shown. In accordance with the invention, other integrated circuit chips (not shown in this illustration) may be connected to the illustrated chip 14 by an optically patterned interconnection process such as the HDI technique mentioned earlier. The illustrated integrated circuit and the others, which are not shown, are supported upon a dielectric substrate 12 typically Al$_2$O$_3$, having a recess 23 for each chip which is slightly larger than the chip and designed to support the chip with its upper surface flush with the upper surface of the substrate. Further in accordance with the invention the interior of the recess 23 and the surrounding upper surface of the substrate are metallized prior to attachment of the chip to form a conductive surface as shown at 24. The metallization 24, augmented by the chip bottom metallization 25, forms the bottom portion of the RF shield formed about the chip 14.

The substrate metallization 24 may take one of several forms suitable for the selected substrate material. The customary process, assuming an alumina (Al$_2$O$_3$) substrate, entails an initial layer of titanium to promote adhesion, a final electroplated gold layer to provide a solderable, highly conductive surface suitable for RF shielding, and often an intermediate layer of chromium for durability.

The chip selected for placement within the shield in FIG. 2, is the low noise amplifier of the module, which may often need RF shielding from the other components. While the circuitry of the LNA chip is not shown, the input/output connections to the chip are generally arranged about the perimeter of the chip, and the bottom metallization 25 provides a ground plane to facilitate efficient RF propagation through the IC. The metallization 25 is preferably gold for compatibility with the gold layer 24 present in the adjacent substrate surfaces At the high frequencies of interest, the active regions of the chip are of the high electron mobility materials such a gallium arsenide. In a monolithic microwave integrated circuit (MMIC) design, the chip supports not only the active transistor devices, typically field effect transistors (FET) or high electron mobility transistors (HEMTs), but also much of the passive circuitry which provides the signal paths shapes the bandpass characteristic and provides for the filtering of the bias supplies.

Assuming that the chip is in place in the substrate recess, the next major step in assembling the shield about the chip is that of attaching a first dielectric layer 26 which also provides the support for a second metallization 27, providing input/output connections to the chip.

In applying the dielectric layer 26, all the substantially coplanar upper surfaces of the substrate and MMIC chips are spray coated with a thin layer of adhesive. A suitable material is the ULTEM TM polyimid siloxane resin, which is applied to an approximate thickness of 10-12 microns. The dielectric layer, itself is a precast sheet 26 of polyimid siloxane having a thickness of 25 microns (1 mil). The sheet 26, which is applied as a single continuous sheet covering the substrate, is placed over the adhesive layer bonding it to the substrate and chips. The sheet 26, aided by the adhesive, forms a dielectric layer which bridges the gaps between the MMIC chips and the surrounding substrate. A suitable material for the first dielectric layer 26 is available under the brand name "Kapton", from Dupont.

The second major step is the application of the second metallization, which provides input/output connections to the chip, and which forms a portion of the sides of the RF shield. Preliminary to metallization, "via holes" 29, 30 respectively are formed through the sheet 26 to contact pads 28 on the top surfaces of the MMIC chips and to the substrate metallization 24 at regular intervals in a line bounding the chip 14 and defining the lateral boundaries of the shield. The intervals between the holes 30 are spaced to provide shielding to the sides of the chip, while allowing passage of the I/O connections to the chip. The via holes 29, 30 are formed by a uv (351 nm) argon ion laser, operated to remove both the layer 26 and the underlying adhesive by ablation. The removal takes place in a narrow circular region over the pads. The contact pads, which are metallized, and substrate metallization, both of which are optically patterned, are designed in concert with laser optically patterned, are designed in concert with laser operation to stop the laser penetration. The via holes are preferably round with tapered walls with a diameter of approximately 25 microns. Other steps may be provided to clear any debris from the via holes.

With the chip contact pads 28 and the portion of the substrate metallization 24 uncovered by the via holes 30 exposed, the module is ready for the second, patterned metallization 27. Metallization 27 is achieved by sputtering a thin unpatterned layer of a metallic conductor such as titanium. The metallization is performed in such a way that not only are the flat upper surfaces of the dielectric layer 26 metallized but also the exposed pads, the exposed substrate metallization and the tapered walls of the "vias". Thus an electrically continuous path is formed between the metallization 27, through the vias to the underlying metallization. The sputtered titanium layer, which is of a few thousand angstroms in thickness, is then electroplated with copper to a final conductor thickness of a fraction of one mil, followed by a few thousand Angstroms of Ti sputtered on top of the Cu.

The patterning of the metallization 27 to provide point-to-point conductor runs and upper contact regions or pads 31 for the shield vias 30 is preferably achieved using a high resolution process (HDI) not requiring conventional multi-step photolithography. A preferred method of patterning entails use of the same argon ion laser used to create "vias". The laser is now operated to polymerize but not to ablate the photo-resist. The photo-resist is selected for sensitivity to light at the 351 nm wavelength of the laser.

The first step in patterning the metallization 30 is the general application of a photo-resist. The photo-resist may be applied as a liquid with any excess being spun off. The laser beam which is used as an activating light source to polymerize the photo-resist, is then swept in a controlled manner over the photo-resist to define the metallization pattern. The beam, typically 3-7 microns in diameter, then sets the resolution of the narrowest feature of the metallization pattern. The laser is computer controlled to provide an overlapping raster scan of the total area of the substrate. During scanning, the beams are turned "on" for exposure of the photo-resist and "off" to avoid exposure of the photo-resist. The 3-7 micron laser beam width is finer than the most detailed feature.

The conductor runs may be 4.5 microns in thickness by 25 microns in width or greater. The wider conductor runs are formed by multiple, overlapping passages of the "on" beam over the photo-resist. The pads 31 for the shield vias are elongated to allow for interconnection between individual vias 30 in the first dielectric layer 26 with a via 32 through the second dielectric layer 33, yet to be formed.

After laser scanning of the substrate is complete, the photo-resist is developed. By exposure, the laser polymerized photo-resist has become resistant to removal by the developer—although the converse could have been chosen. The unpolymerized areas of the photo-resist are removed by the developer leaving the underlying conductive titanium/copper layers exposed. These are removed by acid etching, leaving conductive titanium/copper only where it lies under a protective covering of polymerized photo-resist. When the removal of the uncovered copper is complete, point-to-point conductor runs 27 to the vias 29 and I/O pads 28 and the elongated contact pads 31 connected to the shielding vias 30, and still protected by the polymerized photo-resist, are what remains. The polymerized photo-resist may then be removed by an ether wash to expose conductor runs and shielding pads 31.

The process so far described can accommodate successive dielectric layers (e.g. 26, 33) bearing successive metallizations and additional layers are commonplace. Additional layers for conductive runs provide the means for cross-overs, which are useful in both signal and DC paths. Assuming, however, that only one metallized layer is required for conductor runs 27 and pads 31, a second dielectric layer 33, and a third metallization is required to complete the shield for the chip 14.

The dielectric layer 33 may be applied, as before, or by spinning a liquid polyimid siloxane material over the top surface of the assembly, which does not require a separate adhesive. At intervals, approximately following the same shielding boundary line as the vias 30, a second line of laser etched via holes 32 are formed in the dielectric layer 33. The via holes 32 terminate on the pads 31 with the via holes 29 terminating at the first metallization 24. The dielectric layer 33 is then coated with a thin sputtered titanium and copper plated layer 34, which as before, is unpatterned and extends down through the via holes 32 to the pads 31. As illustrated in FIG. 3, the via holes 32 are staggered in relation to the via holes 30, but are arranged in pairs such that each metallized pair of vias makes contacts with the same intermediate pad. The mutually staggered arrangement of via holes 30, 32 with the elongated intermediate pad 31 simplifies the registration of the electrical connections for electrical continuity between the to 34 and bottom 24 shield metallizations and improves the height-to-diameter aspect ratio of the via holes to facilitate a more uniform thickness of the metallization on the side walls of the vias. As mentioned earlier, the via holes 30, 32 and the pad 31 are spaced from any patterned conductors leading to the pads 28 for signal and DC connections to the chip.

The metallization 34 may now be patterned to complete the top portion of the electrical shield using a conventional photo-resist process. The metallization 34, which generally extends over the assembly and which penetrates the vias 32 is now coated by a photo-resist. Assuming conventional optical patterning, the photo-resist may be exposed to uv illumination through a mask to define the boundaries of the top of the RF shield. The area of the shield is now exposed through the pattern top uv illumination and polymerized. The remainder of the photo-resist layer is not exposed. The photo-resist is then processed with a developer which removes all unexposed photo-resist. The portion of the titanium/copper layer 34 uncovered by the removal of the photo-resist, is then removed by an acid etch, leaving only the titanium/copper for the top of the shield and the vias 32 protected by the polymerized photo-resist. The polymerized photo-resist is then removed by an ether wash exposing a patterned top shield which now completes the optically patterned shield about the chip 14.

The top RF shield metallization 34 as illustrated in FIG. 3, is without apertures, and extends over the top surface of the chip 14, outwardly to the vias 32, 30, by means of which the top of the RF shield is connected to the metallization forming the bottom of the RF shield. The vias, in pairs (30, 32) are arranged around the chip over the adjacent portion of the substrate. As noted earlier, they may be spaced closely enough to preclude significant RF leakage, while permitting the I/O connectors to be made to the chip 14.

In general, the requirement for an open "cage" is that the bars (i.e. vias) not be spaced more widely than 1/10 of a wave to maintain a shielding effect. At one Gigahertz, the wavelength in polyimide is approximately 15 centimeters, and at 10 Gigahertz 1.5 cm. Therefore, the spacing should be 1.5 cm at 1 Gigahertz and 0.15 cm at 10 Gigahertz. In practice, the dielectric layers are from 1 to 2 mils in thickness, and the vias are conveniently applied at intervals as close as 0.05 cm.

The invention has been disclosed in a form in which two dielectric layers 26 and 33 are provided, the layer 26 providing the support for conductor runs, and the upper layer providing support for the shield metallization 34. More than two dielectric layers are often desirable, particularly to provide cross-overs in the connections made between the chips. The process for adding dielectric layers may be repetitive of the process for forming the initial or second layer in such cases, and generally the shielding will be placed on one of the higher layers.

The vias may penetrate more than one dielectric layer at a time, rather than only one layer at a time as disclosed. The disclosed process is more reliable under certain conditions, but both methods of forming the vias are practical, and often interchangeable.

The shield layer 34 affects the electrical properties of the MMIC components disposed beneath. The principal change is the creation of additional capacitance between circuit elements and ground, with little or no dissipation loss. Accordingly, the circuit must be designed, taking into account the effect of shielding.

The shielding has been characterized as optically patterned, it being understood that the term would equally apply to the ablative removal of material from the dielectric, the non-ablative exposure of the photo-resist to a tiny scanned laser beam (both of which are disclosed), as well as to the more conventional optical patterning, using masks with flooded illumination.

What is claimed is:

1. In combination,
   (A) an integrated circuit chip for analog and/or digital operation at microwave frequencies,
   (B) a substrate, a portion of which has a recess for supporting said integrated circuit chip with the upper surface flush with the substrate surface,
   (C) an optically patterned RF shield enclosing said chip comprising
      (1) a first metallization covering the interior of the recess and the upper surface of said substrate adjacent said recess to form the bottom and a part of the sides of said RF shield,
      (2) an optically patterned first dielectric layer bonded to said chip and substrate, having a first set of local perforations spaced along a line bounding said chip penetrating to said first metallization,
      (3) an optically patterned second metallization bonded to said first dielectric layer to provide conductive paths via said first set of perforations to said first metallization to form a cage-like part of the sides of said RF shield, the spacing between said first set of perforations being adequately small to prevent passage of RF waves at frequencies of interest,
      (4) an optically patterned second dielectric layer bonded to said first dielectric layer, having a second set of local perforations spaced along said line, penetrating to said second metallization, and
      (5) an optically patterned third metallization bonded to said second dielectric layer, having a central portion extending over said recess to said second set of perforations to provide conductive paths via said second set of perforations to said second metallization, the spacing between said second set of perforations being adequately small to prevent passage of RF waves at frequencies of interest, said third metallization forming the top and completing the cage-like sides of said RF shield.

2. In a module for analog and/or digital operation at microwave frequencies, the combination comprising
   (A) a plurality of integrated circuit chips in close proximity, electrically connected by a succession of at least one optically patterned dielectric layer containing local perforations and an optically patterned metallization formed on said dielectric layer, and lining said perforation,
   (B) a substrate for supporting said integrated circuit chips in said module, a portion of said substrate having a recess for supporting one integrated circuit chip with the upper surface flush with the substrate surface,
   (C) an optically patterned RF shield for shielding said one chip from the other chips of said plurality comprising
      (1) a first metallization covering the interior of the recess and the upper surface of said substrate portion to form the bottom and a part of the sides of said RF shield,
      (2) an optically patterned first dielectric layer, bonded to said one chip and substrate portion, having a first set of local perforations spaced along a line bounding said one chip, penetrating to said first metallization,
      (3) an optically patterned second metallization, bonded to said first dielectric layer to provide conductive paths via said first set of perforations to said first metallization to form another part of the sides of said RF shield, the spacing between said first set of perforations being adequately small to prevent passage of RF waves at frequencies of interest,
      (4) an optically patterned second dielectric layer bonded to said first dielectric layer, having a second set of local perforations spaced along said line, penetrating to said second metallization, and
      (5) an optically patterned third metallization, bonded to said second dielectric layer, having a central portion extending over said recess to said second set of perforations to provide conductive paths via said second set of perforations to said second metallization, to form the top and complete the sides of said RF shield, the spacing between said second set of perforations being adequately small to prevent passage of RF waves at frequencies of interest,
   at least one dielectric layer and the metallization bonded thereto of said RF shield being common to a dielectric layer and metallization used for electrical connection between chips.

3. In combination,
   (A) an integrated circuit chip for analog and/or digital operation at microwave frequencies,
   (B) a substrate, a portion of which has a recess for supporting said integrated circuit chip with the upper surface flush with the substrate surface,
   (C) an optically patterned RF shield enclosing said chip,
      (1) the bottom and a part of the sides comprising a first metallization covering the interior of the recess and the upper surface of said substrate adjacent said recess, and
      (2) another part of the sides comprising a first optically patterned dielectric layer having a first set of local perforations spaced along a line bounding said chip, and an optically patterned second metallization bonded to said first dielectric layer, to provide electrically conductive paths via said first set of perforations to said first metallization, the spacing between perforations being adequately small to prevent passage of RF waves at frequencies of interest.

4. The combination set forth in claim 3 having in addition thereto
      (3) an optically patterned second dielectric layer bonded to said first dielectric layer, having a second set of local perforations spaced along a line bounding said chip, and
      (4) an optically patterned third metallization bonded to said second dielectric layer, having a central portion extending over said recess to said second set of perforations to provide conductive paths via said second set of perforations to said second metallization to form the top and a second part of the cage-like sides of said RF shield, the spacing between perforations in said second set being adequately small to prevent passage of RF waves at frequencies of interest.

5. In a module for analog and/or digital operation at microwave frequencies, the combination comprising (A) a plurality of integrated circuit chips in close proximity, electrically connected by a succession of at least one optically patterned dielectric layer containing local perforations and an optically patterned metallization formed on said dielectric layer, and lining said perforation, (B) a substrate for supporting said integrated circuit chips in said module, a portion of said substrate having a recess for supporting one integrated circuit chip with the upper surface flush with the substrate surface, (C) an optically patterned RF shield for shielding said one chip from the other chips of said plurality, (1) the bottom and a part of the sides comprising a first metallization covering the interior of the recess and the upper surface of said substrate portion, and (2) another part of the sides comprising an optically patterned first dielectric layer having a first set of local perforations spaced along a line bounding said one chip, and an optically patterned second metallization bonded to said first dielectric layer to provide electrically conductive paths via said first set of perforations to said first metallization, the spacing between said first set of perforations being adequately small to prevent passage of RF waves at frequencies of interest.

6. The combination set forth in claim 5 wherein:

the first dielectric layer and the metallization bonded thereto are common to a dielectric layer and metallization used for electrical connection between chips.

7. The combination set forth in claim 5 wherein the top and another part of the sides of said RF shield includes (3) an optically patterned second dielectric layer bonded to said first dielectric layer, having a second set of local perforations spaced along a line bounding said one chip, and (4) an optically patterned third metallization bonded to said second dielectric layer to provide conductive paths via said second set of perforations to said second metallization to form a second part of the sides of said RF shield, the spacing between perforations in said second set being adequately small to prevent passage of RF waves at frequencies of interest, at least one dielectric layer and the metallization bonded thereto of said RF shield being common to a dielectric layer and metallization used for electrical connection between chips.

* * * * *